United States Patent [19]

Ritt et al.

[11] Patent Number: 4,865,953
[45] Date of Patent: Sep. 12, 1989

[54] METHOD FOR MAKING A STENCIL WITH A BORAX-FREE, LOW-DICHROMATE, CASEIN PHOTORESIST COMPOSITION

[75] Inventors: Peter M. Ritt, West Lampeter Township, Lancaster County; Kevin M. Rapp; Kenneth G. Minnerly, both of Lititz, all of Pa.

[73] Assignee: RCA Licensing Corp., Princeton, N.J.

[21] Appl. No.: 101,698

[22] Filed: Sep. 28, 1987

[51] Int. Cl.$^4$ ................................. G03C 5/00
[52] U.S. Cl. ..................... 430/322; 430/28; 430/270; 430/323; 430/330
[58] Field of Search ............ 430/23, 29, 28, 321, 430/323, 330, 5, 313, 318, 331, 270, 322

[56] References Cited

U.S. PATENT DOCUMENTS

| | | | |
|---|---|---|---|
| 2,716,061 | 8/1955 | Lupo, Jr. | 95/7 |
| 2,822,280 | 2/1958 | Martin | 106/146 |
| 2,921,852 | 1/1960 | Caton | 96/93 |
| 3,653,900 | 4/1972 | Black | 430/323 |
| 3,666,462 | 5/1972 | Kaplan | 430/323 |
| 4,061,529 | 12/1977 | Goldman et al. | 430/323 |
| 4,208,242 | 6/1980 | Zampiello | 430/323 |
| 4,230,781 | 10/1980 | Piascinski et al. | 430/323 |
| 4,230,794 | 10/1980 | McCarthy | 430/313 |
| 4,259,421 | 3/1981 | Goldman | 430/323 |
| 4,401,508 | 8/1983 | Ritt | 430/323 |
| 4,429,028 | 1/1984 | Kuzminski | 430/323 |
| 4,565,755 | 1/1986 | Ohtake et al. | 430/323 |
| 4,664,996 | 5/1987 | Moscony et al. | 430/323 |

Primary Examiner—Jose G. Dees
Assistant Examiner—Donald J. Loney
Attorney, Agent, or Firm—Joseph S. Tripoli; Dennis H. Irlbeck; Vincent J. Coughlin, Jr.

[57] ABSTRACT

The method comprises applying to a surface to be etched a coating of a borax-free, low dichromate, casein photoresist liquid composition comprising an acid-precipitated casein, sodium hydroxide as an alkalizing agent, an alkali dichromate photosensitizer and water. The composition has a pH in the range of 6.0 to 7.0, and reduced quantities of the alkalizing agent and photosensitizer compared to prior coating compositions.

3 Claims, 1 Drawing Sheet

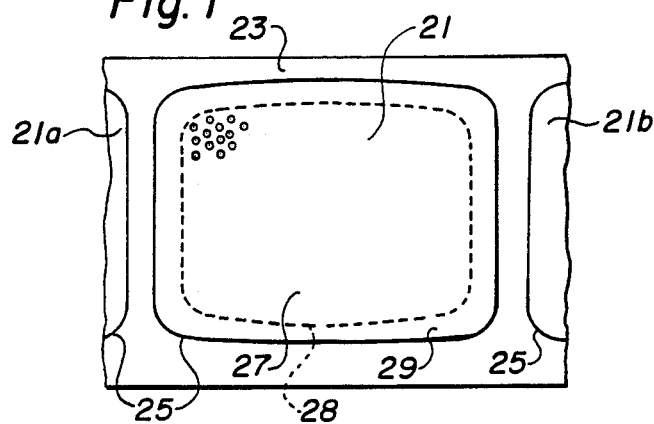
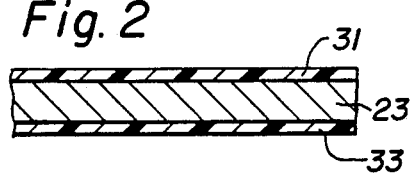 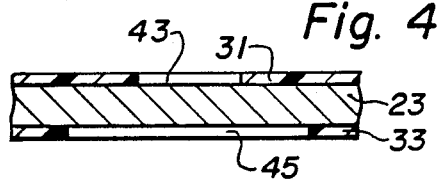
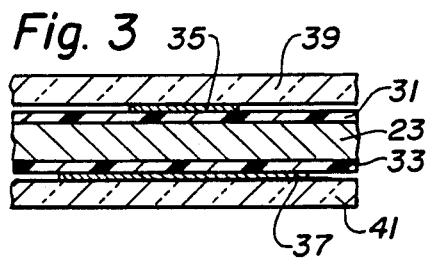 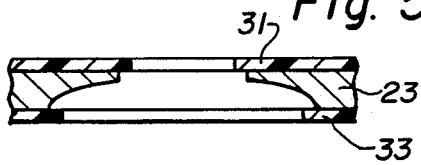

METHOD FOR MAKING A STENCIL WITH A BORAX-FREE, LOW-DICHROMATE, CASEIN PHOTORESIST COMPOSITION

This invention relates to a water based photoresist composition for making a stencil and, more particularly, to a method of making a stencil with a borax-free, low dichromate, casein resist composition.

BACKGROUND OF THE INVENTION

Water based photoresists based on natural, sensitizable protein products such as fish glue, albumin ad casein have been known for a number of years. A useful photoresist composition comprises casein, make by acid precipitation of milk, an alkali metal base to impart a pH of 7.7 or higher which improves the solubility of the natural product in water, and an ammonium dichromate sensitizer.

U.S. Pat. No. 4,061,529 issued on Dec. 6, 1977 to Goldman and Datta, herein incorporated by reference, discloses the addition of sodium borate as the base in a concentration so that the resist solution has a final pH of 6.7–7.3, to improve the pot life of the coating composition and the shelf life of coated substrates.

These resists have been employed extensively in the lithographic printing arts and in the manufacture of shadow masks for color television picture tubes. A cleaned metal surface or substrate is coated with the aqueous photoresist and dried. A master having a desired pattern is contacted to the resist and exposed to ultraviolet light which hardens the resist in the exposed areas. The resist film is then washed with water to dissolve the unexposed resist and thereby uncover part of the metal substrate. The now partially coated substrate is then dried and baked for about 5 minutes at a temperature of from 500°–550° F. (260°–287° C.). This step is required to render the remaining photoresist etch resistant. The partially coated substrate is then etched by spraying with hot ferric chloride solution which etches away the bared metal portions. The residual resist can then be removed in a hot alkali solution.

The above process has been universally adopted for television shadow mask production because of its low cost, e.g. the photoresist, water rinse and caustic wash solutions are very inexpensive as compared to organic based photoresists.

The photoresist formulation described in U.S Pat. No. 4,061,529 typically contains 17–20 weight percent borax (hydrated sodium borate) and about 22 weight percent ammonium dichromate. The patentees believe that the borax alkalizing agent solubilizes the casein without degrading it and further retards the curing of the photoresist composition in the absence of light thereby improving shelf life.

While the above-described photoresist formulation is satisfactory for its intended purposes, further improvements in the formulation can be achieved by utilizing a different alkalizing agent, reducing the amount of the dichromate sensitizer and reducing the pH of the final resist composition within the range of about 6.0 to 7.0. The present novel method of making a borax-free resist formulation provides a film that has improved visual uniformity since the elimination of borax, which makes no positive photochemical contribution to the resist composition, removes some impurities from the photoresist. The present borax-free formulation also has increased both photosensitivity (borax served as an inhibitor during exposure), and shelf life by reducing the dichromate concentration over that disclosed in U.S. Pat. No. 4,061,529. The borax-free resist is less expensive than the resist of U.S. Pat. No. 4,061,529 since borax has been eliminated and replaced with a lower concentration of sodium hydroxide, also the dichromate concentration has been reduced and the concentration of casein has remained unchanged.

SUMMARY OF THE INVENTION

In the novel method, a photoresist composition comprises an acid-precipitated casein as the sensitizable protein material, an alkali dichromate photosensitizer therefor, sodium hydroxide as an alkalizing agent and water. The quantities of the alkalizing agent and dichromate photosensitizer are reduced over similar prior art photoresist compositions so that the pH of the composition is in the range of about 6.0 to 7.0.

The composition may be applied as a coating to the major surfaces of a metal sheet, dried, photoexposed, developed to produce stencils and then baked to make the stencils etch resistant. An apertured mask for a color cathode-ray tube (CRT) may be formed by applying a suitable etchant for the metal sheet to both surfaces thereof until the sheet is etched a desired amount.

BRIEF DESCRIPTION OF THE DRAWINGS

FIG. 1 is a plan view of a metal sheet after etching according to the novel method.

FIGS. 2 through 5 are sectional views through one aperture of a metal sheet illustrating the steps of one embodiment of the novel method.

DETAILED DESCRIPTION OF THE PREFERRED EMBODIMENT

FIG. 1 shows a plan view of an etched apertured mask blank 21 as it emerges from the etching machine. The mask blank 21 (which is to be used in a color-television picture tube) is in a metal sheet 23 comprising a succession of such mask blanks 21a, 21 and 21b which are etched through at the margins 25 thereof except at convenient points (not indicated) sufficient to hold the mask blank 21 in place in the sheet 23. The mask blank 21 is comprised of an apertured central portion 27 defined by the broken line 28; and a skirt or peripheral portion 29 which is not apertured, although in some embodiments it may be etched partly through. This application is particularly concerned with the etch-resistant stencil used for etching the apertures in the apertured central portion 27. The apertures may be round and arranged in a hexagonal, diamond-shaped or other array. Or, the apertures may be rectangular slits arranged in vertical rows; for example, 6-mil (0.15 mm) by 30-mil (0.76 mm) slits on 30-mil (0.76 mm) centers. The apertures also may be of other shapes and arrangements. In any of the embodiments, the aperture width may be uniform across the mask or may be graded in width or diameter from the center to the edge of the array as is known in the art.

The mask blank 21 is etched into a regular-carbon or a low-carbon cold-rolled-steel sheet about 4 (0.10 mm) to 10 (0.25 mm) mils in thickness. The etching may also be conducted in sheets of other materials, such as invar alloy, or a copper-nickel alloy. The sheet 23 is passed through the various operations including cleaning the sheet, producing etch-resistant stencils on the sheet, etching the sheet to produce the apertures and to define the mask blanks, and then stripping the stencils from the sheet. Subsequently, the mask blanks 21 are torn from the sheet 23. The mask blanks 21 are then heat treated (annealed), roller leveled, formed on a press, and then blackened as is known in the art, to produce masks suitable for assembly into a color-television picture tube.

FIGS. 2, through 5 illustrate the novel method by a sequence of steps that may be used in making a round aperture in the central portion 27 of a hexagonal array of apertures in a 6-mil (0.15 mm)-thick strip of low-carbon cold-rolled steel, as shown in FIG. 1. The sheet 23 is coated on both major surfaces with the liquid coating composition set forth below. The coating is dried in air, producing light-sensitive coatings 31 and 33 of dichromate-sensitized casein, as shown in FIG. 2. After the coatings have dried, the coated strip is positioned in a chase, such as is shown in U.S. Pat. No. 3,751,250 to J. J. Moscony et al., between two light-opaque master patterns; one master pattern 35 for the coating 31 on the one major surface of the sheet 33, and the other master pattern 37 for the other coating 23 on the other major surface of the sheet 23 as shown in FIG. 3. The light-opaque patterns may be of chromium or nickel metal coated on the inner surfaces of glass plates 39 and 41, respectively, so that the patterns physically contact the coatings 31 and 33. The one master pattern 35 has a circular shape about 5 mils (0.13 mm) in outside diameter. The other master pattern 37 has a circular shape about 16 mils (0.41 mm) in diameter. Center lines of the one and the other master patterns are coincident, but may be offset from one another if desired.

With the patterns 35 and 37 positioned as shown in FIG. 3, the coatings 31 and 33 on each of the surfaces of the sheet 23 are now exposed to hardening radiation, as from a carbon-arc source, or xenon radiation lamp, which radiation passes through the glass plates 39 and 41 incident on the coatings 31 and 33. The radiation insolubilizes the coatings 31 and 33 except where the one and the other master patterns 35 and 37 shadow the coatings. When the coatings are suitably exposed, the exposure is stopped, and the master patterns are removed.

The coatings 31 and 33 are now developed as by flushing with water or other solvent to remove the unexposed, more-soluble, shadowed portions of the coatings 31 and 33. As shown in FIG. 4, after development, the sheet 23 carries on its one major surface a stencil comprising a coating 31 having a first circular opening 43 therein and, on its other major surface, a stencil comprising a coating 33 having a second circular opening 45 therein. The stencil coatings 31 and 33 with the openings 43 and 45 therein are now baked in air at about 260° to 350° C. to develop better etch-resistance in the coatings.

The sheet 23 with the etch-resistant stencils thereon is now selectively etched from both sides thereof in a single step or in successive steps to produce the desired aperture. FIG. 5 shows the stencil-coated sheet 23 at the end of etching. The etching is conducted in the usual manner employing a ferric-chloride hydrochloric-acid liquid etchant. Controlled amounts of chlorine gas are fed into the etchant to maintain its etching strength.

After the etching has been completed, the coated sheet 23 is washed with water to remove any residual etchant. Then, the etch-resistant stencils 31 and 33 are removed from the sheet 23, as by spraying thereon an aqueous solution of sodium hydroxide maintained at temperatures of about 50° to 80° C. After removing the stencils, the sheet 23 is washed in water and dried.

EXAMPLE

The liquid coating composition used in the novel method is prepared by forming a sodium caseinate solution comprising:
680 ml., of a sodium hydroxide solution containing 25 percent by weight of sodium hydroxide;
60,000 ml., of water; and
6,000 g., of an acid-precipitated casein.

The solution is heated in the range of 70° to 95° C., with 80° to 85° C. being preferred, and stirred using a propeller-type mixer for 10 to 30 minutes. The sodium caseinate solution is then cooled to room-temperature (23° C.). Tests have shown this sodium caseinate solution can be held for a week in ambient conditions without developing any bacterial growth. It is believed that the need for a preservative for casein solutions held less than a week, which is typical for most shadow mask production facilities, is unnecessary. The pH of the cooled solution is typically in the range of 8.0 to 8.5.

A wetting agent, such as IGEPAL, commercially available from GAF Corporation, comprising 0.01 to 0.04 percent by weight of the casein, 15 added to the solution. A dichromate photosensitizer, such as ammonium or sodium dichromate, comprising about 5 to 20 percent by weight of said casein and preferably 5 to 15 percent by weight, is added to the solution. The final composition has a pH in the range of 6.0 to 7.0.

GENERAL CONSIDERATIONS

The preferred borax-free photoresist composition utilizes a solution containing 3 percent by weight of casein of sodium hydroxide as an alkalizing agent to solubilize the casein. The prior resist formulation used in the RCA process utilized 17 to 20 percent by weight of borax to accomplish the same thing. In the composition used in the novel process, the reduction of solids and the elimination of borax, which makes no photochemical contribution to the photoresist, permits a lower dichromate level (15 percent by weight of casein vs. 22 percent by weight for the prior RCA solution) which REDUCES the cost of the photoresist and provides hold-time flexibility without loss of photosensitivity. Additionally, the reduction of constituents not contributing to the crosslinking process provide a more optically pure resist film which theoretically enhances uniformity.

It has been determined that the amount of the sodium hydroxide in the sodium caseinate solution can range between about 2 to 18 percent by weight of casein, and optimally between about 2 to 6 percent by weight of casein without adversely affecting the photoresist composition.

What is claimed is:
1. A method for producing a stencil upon a surface comprising applying to said surface a coating of a borax-free, low dichromate, casein photoresist liquid composition having enhanced optical purity and uniformity consisting essentially of
   a. an aqueous solution of an acid-precipitated casein and sodium hydroxide as an alkalizing agent to solubilize said casein, said sodium hydroxide comprising about 3 percent by weight of said casein,
   b. a wetting agent comprising about 0.01 to 0.04 percent by weight of said casein, c. and a dichromate photosensitizer selected from the group consisting of ammonium dichromate and sodium dichromate, said photosensitizer comprising about 5 to 20 percent by weight of said casein to obtain said composition having a pH in the range of about 6.0 to 7.0, drying said coating, photoexposing said dry coating to a light image, developing said exposed coating to produce said stencil and then baking said stencil in air to render said stencil etch-resistant.

2. The method as described in claim 1, wherein in step a. said concentrate is heated in the range of about 70° to 95° C.

3. The method as described in claim 2, wherein the heated concentrate is cooled to room temperature, the pH of said cooled solution being in the range of 8.0 to 8.5 prior to performing step c.

* * * * *

UNITED STATES PATENT AND TRADEMARK OFFICE
CERTIFICATE OF CORRECTION

PATENT NO. : 4,865,953
DATED : Sept. 12, 1989
INVENTOR(S) : Peter M. Ritt, Kevin M. Rapp, Kenneth G. Minnerly It is certified that error appears in the above-identified patent and that said Letters Patent is hereby corrected as shown below:

Column 1, line 13, change "ad" to --and--.

Column 3, line 20, change "33" to --23--.

Column 3, line 21, change "23" to --33--.

Column 4, line 25, change "15" to --is--.

Column 4, line 45, change "REDUCES" to --reduces--.

Signed and Sealed this

Eighteenth Day of September, 1990

Attest:

HARRY F. MANBECK, JR.

*Attesting Officer*  *Commissioner of Patents and Trademarks*